United States Patent
Qi et al.

(10) Patent No.: US 6,552,928 B1
(45) Date of Patent: Apr. 22, 2003

(54) READ-WRITE CONTROL CIRCUIT FOR MAGNETIC TUNNEL JUNCTION MRAM

(75) Inventors: Qiuqun Qi, Fremont, CA (US); Xizeng Shi, Fremont, CA (US)

(73) Assignee: Read-Rite Corporation, Fremont, CA (US)

(*) Notice: Subject to any disclaimer, the term of this patent is extended or adjusted under 35 U.S.C. 154(b) by 0 days.

(21) Appl. No.: 10/011,063

(22) Filed: Nov. 8, 2001

Related U.S. Application Data

(60) Provisional application No. 60/271,323, filed on Feb. 23, 2001.

(51) Int. Cl.[7] .............................................. G11C 11/14
(52) U.S. Cl. ....................................................... 365/171
(58) Field of Search ................................ 365/158, 171, 365/173, 189.01, 189.08

(56) References Cited

U.S. PATENT DOCUMENTS

| | | | |
|---|---|---|---|
| 5,940,319 A | | 8/1999 | Durlam et al. |
| 6,317,376 B1 | | 11/2001 | Tran et al. |
| 6,388,917 B2 | * | 5/2002 | Hoffmann et al. .......... 365/158 |
| 6,404,671 B1 | * | 6/2002 | Reohr et al. ................ 365/158 |
| 6,473,335 B2 | * | 10/2002 | Bohm et al. ................ 365/158 |
| 6,487,109 B2 | * | 11/2002 | Thewes et al. ............. 365/158 |

\* cited by examiner

*Primary Examiner*—Son T. Dinh
(74) *Attorney, Agent, or Firm*—Carr & Ferrell LLP

(57) ABSTRACT

An MRAM data storage device has at least one digit line, at least one bit line, and at least one MRAM cell disposed proximate to a digit line and electrically connected to a bit line. Each end of each digit line is connected to a write current source and a write current sink. One end of each bit line is connected to a write current source and a read current source while the other end of each bit line is connected to a write current sink. Two logic signals R and D are used to determine the direction of the write current in the digit line, to select between the read current and the write current in the bit line. The state of the MRAM cell is read by detecting the voltage drop across the cell when a read current is applied.

53 Claims, 3 Drawing Sheets

READ-WRITE CONTROL CIRCUIT FOR MAGNETIC TUNNEL JUNCTION MRAM

This application claims the benefit of U.S. Provisional application Ser. No. 60/271,323 filed on Feb. 23, 2001.

BACKGROUND

1. Field of the Invention

The present invention relates generally to data storage and more particularly to control circuitry for selectively writing to and reading from Magnetic Random Access Memory (MRAM) units.

2. Description of the Prior Art

A wide range of presently available media for data storage vary in several attributes including access speed, duration of reliable storage, and cost. Static Random Access Memory (SRAM) is the storage medium with the best access speed for the cost in applications such as cache memories. However, SRAM is volatile, meaning that it only maintains storage while power is continuously applied. Accordingly, computer users endure lengthy waits when they power-up their computers while substantial amounts of data are written from non-volatile but slow media, such as magnetic disks, into much faster random access memory (SRAM).

Flash memory has been proposed as an alternative to SRAM. Flash memory is a solid-state storage medium that provides moderate access times and that is non-volatile. Flash memory has the disadvantage that it has a limited lifetime, on the order of one million cycles per cell, after which a cell can no longer be written to. This lifetime is orders of magnitude too short for a random access memory in most modern computing system.

Another solid-state storage medium is Magnetic Random Access Memory (MRAM), which employs a Magnetic Tunnel Junction (MTJ) formed of layers of magnetic material. FIG. 1 shows a cross-section of a prior art MRAM unit 10 including an MTJ 12 formed of a pinned layer 14 and a free layer 16, which are magnetic layers typically formed of ferromagnetic materials, and a thin dielectric layer 18 disposed between layers 14 and 16. Pinned layer 14 has a magnetic moment orientation 20 that is fixed from rotating, while free layer 16 has a magnetic moment orientation 22 that is free to rotate in response to external magnetic fields. Methods of pinning a pinned layer 14 are well known in the art and include the use of an adjacent antiferromagnetic layer (not shown).

In an MRAM unit 10, a bit of data is encoded in the direction of the magnetic moment orientation 22 of the free layer 16 relative to the magnetic moment orientation 20 of the pinned layer 14. As is well known in the art, when the two magnetic moment orientations 20, 22 are parallel the resistance measured across the MTJ 12 is relatively low, and when the two magnetic moment orientations 20, 22 are antiparallel the resistance measured across the MTJ 12 is relatively high. Accordingly, the relative state of the magnetic moment orientations 20, 22, either parallel or antiparallel to one another, can be determined by reading the resistance across the MTJ 12 with a read current. Typical read currents are on the order of 1–50 $\mu$A.

In an MRAM unit 10, the state of the bit, parallel or antiparallel and representing 0 or 1, for example, is varied by applying a write current $I_w$, typically on the order of 1–25mA, through two conductors, a bit line 24 and a digit line 26, situated proximate to the MTJ 12. The intensity of the write current applied to the bit line 24 may be different than that applied to the digit line 26. The bit line 24 and the digit line 26 cross one another at right angles above and below the MTJ 12. As is well known in the art, although the pinned layer 14 is depicted in FIG. 1 as nearer to the bit line 24, an MRAM unit 10 also functions with the pinned layer 14 nearer to the digit line 26.

As is well known, a magnetic field develops around an electric current in a wire. Accordingly, two magnetic fields arise when write currents $I_w$ are simultaneously applied to both the bit line 24 and the digit line 26. The two magnetic fields combine at the free layer 16 to determine the magnetic moment orientation 22. The magnetic moment orientation 22 of the free layer 16 is made to alternate between the parallel and antiparallel states by alternating the direction of the write current $I_w$ in either the bit line 24 or the digit line 26. Alternating (by a write control circuit, not shown) the direction of the write current $I_w$ in one of the lines 24, 26 reverses the direction of the magnetic field around that conductor and thereby reverses the direction of the combined magnetic field at the free layer 16.

In an MRAM unit 10, the state of the bit is read by passing a read current $I_R$ through the MTJ 12. In these designs a transistor 30 is used to allow the read current $I_R$ to flow through the MTJ 12. during a read operation while preventing the write current $I_w$ from flowing through the MTJ 12 during a write operation.

A control signal is required to determine which direction the reversible write current $I_w$ will flow. Another control signal is required to change the state of the transistor 30 for read and write operations. Accordingly, what is desired is a read/write logic control circuit and write current direction circuit for an MRAM unit 10 that does not require additional logic compared with existing volatile memory media and can therefore allow MRAM units to be readily integrated into the existing RAM products.

SUMMARY

A write control circuit for a magnetic tunnel junction MRAM provides a digit line and a bit line. The digit line includes a first end electrically connected to a first write current source by a first write transistor controlled by a first write logic gate, a first write current sink electrically connected to the first end by a first sink transistor controlled by a first sink logic gate, a second end electrically connected to a second write current source by a second write transistor controlled by a second write logic gate, a second write current sink electrically connected to the second end by a second sink transistor controlled by a second sink logic gate, and a segment proximate to the magnetic tunnel junction MRAM having a first direction. The bit line includes a third write current source electrically connected to a first end, a third write current sink electrically connected to a second end, and a segment proximate to the magnetic tunnel junction MRAM having a second direction oriented approximately 90° to the first direction.

The write control circuit advantageously places one write current source and one write current sink on either end of the digit line to allow the write current to flow through the digit line in either direction. The direction of the write current in the digit line determines the orientation of the associated magnetic field and thereby determines the orientation of a magnetic moment of a free layer of the magnetic tunnel junction.

In the write control circuit the first and second write transistors can be p-channel MOS transistors and the first and second write logic gates can be NAND gates. In such embodiments the first write logic gate can be configured to accept first and second logic signals and the second write logic gate can be configured to accept the first logic signal and the inverse of the second logic signal. Similarly, the first and second sink transistors can be n-channel MOS transistors and the first and second sink logic gates can be NOR gates, and likewise the first sink logic gate can be configured to accept first and second logic signals and the second sink logic gate can be configured to accept the first logic signal and the inverse of the second logic signal. These embodiments are advantageous because they allow for the use of only two logic signals to selectively establish an electrical path between either write current source and the write current sink on the other end of the digit line.

A read/write control circuit for a magnetic tunnel junction MRAM provides a digit line and a bit line as described above where a read current source is electrically connected to the first end of the bit line by a first read transistor. A first surface of the magnetic tunnel junction MRAM is connected to the bit line between the first and second ends, and a second surface of the magnetic tunnel junction MRAM is connected to a read current sink by a second read transistor. The inclusion of the read current source and the read current sink to the previously described write control circuit further allows the invention to direct a read current through the magnetic tunnel junction MRAM.

In the read/write control circuit of the invention the third write transistor can be controlled by a first logic signal and the first read transistor can be controlled by an inverse of the first logic signal, allowing one logic signal to determine the current source connected to the bit line. Similarly, the third sink transistor can be controlled by a first logic signal and the second read transistor can be controlled by an inverse of the first logic signal so that one logic signal can determine whether the read current will flow through the magnetic tunnel junction or whether the write current will be directed past the magnetic tunnel junction to a write current sink.

A magnetic data storage unit of the invention provides a magnetic tunnel junction MRAM and digit and bit lines as described above. The magnetic tunnel junction MRAM can include a pinned layer electrically connected to the read current sink and located proximate to the digit line, a free layer electrically connected to the bit line, and a spacer layer disposed between the pinned and free layers. These embodiments provide a complete memory unit including a magnetic tunnel junction and a control circuit therefore.

A magnetic tunnel junction MRAM data storage device of the invention provides at least one digit line including a digit line transistor, at least one bit line including a bit line transistor, and at least one MRAM cell disposed proximate to one of the at least one digit line, electrically connected to one of the at least one bit line, and including a read current sink electrically connected to a magnetic tunnel junction by a read transistor. The at least one digit line includes first and second write current sources electrically connected to opposite ends of the at least one digit line and first and second write current sinks electrically connected to opposite ends of the at least one digit line. Similarly, the bit line includes a third write current source and a read current source each electrically connected to a first end of the at least one bit line and a third write current sink electrically connected to a second end of the at least one bit line. Additionally, the invention includes a column decoder configured to activate one of the at least one bit line by applying a first voltage to a gate of the digit line transistor and a row decoder capable of activating one of the at least one digit line by applying a second voltage to a gate of the digit line transistor. Lastly, the invention includes a read control line having a first end connected to the gate of the digit line transistor and a second end connected to a gate of the read transistor of the at least one MTJ cell. The read control line includes a read control line transistor disposed between the two ends, and a gate of the read control line is controlled by a first logic signal.

BRIEF DESCRIPTION OF DRAWINGS

The present invention is illustrated by way of example, and not by way of limitation, in the figures of the accompanying drawings where like reference numerals refer to similar elements and in which.

DETAILED DESCRIPTION OF THE INVENTION

Figure 1:
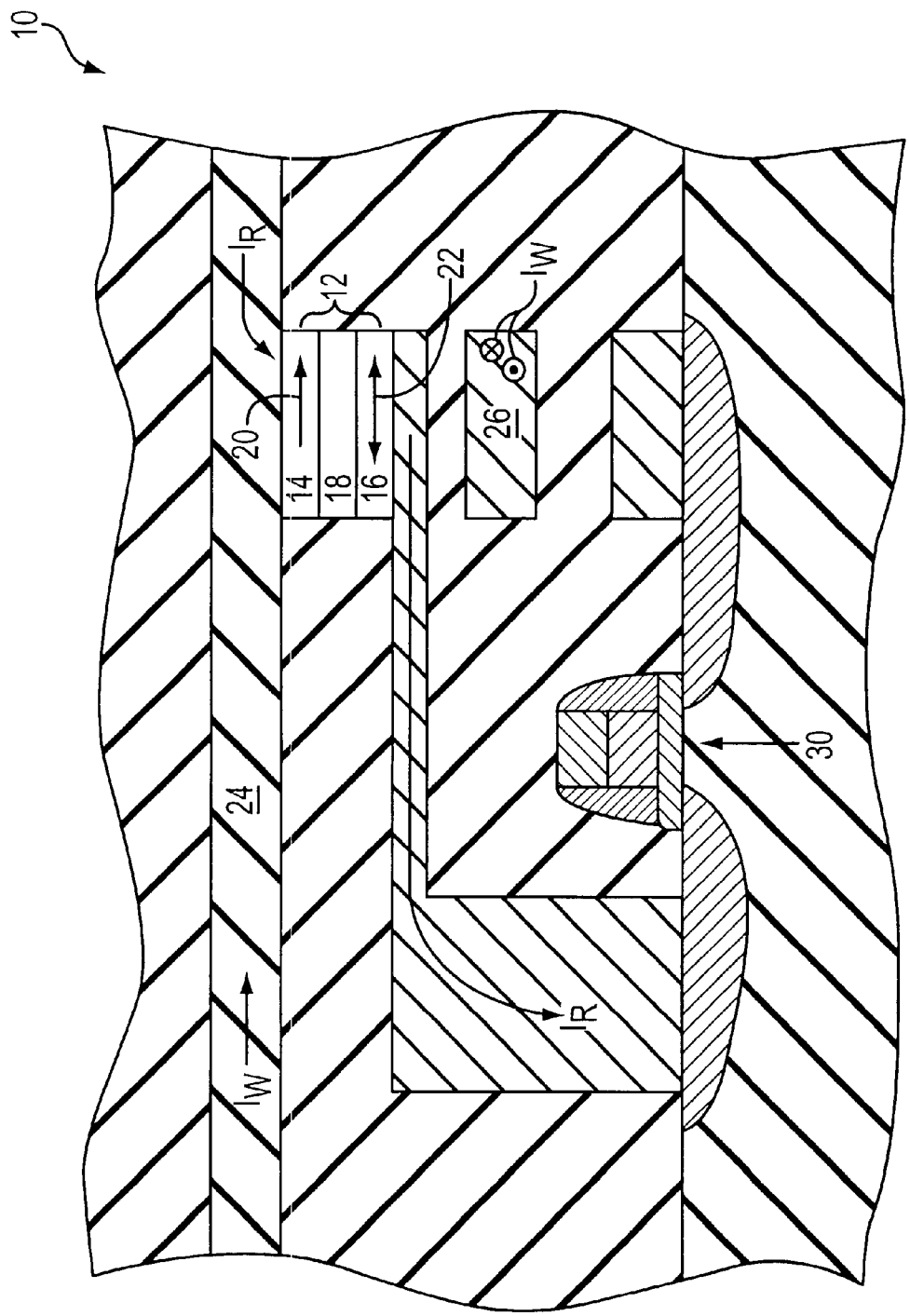
FIG. 1 is a cross-sectional representation of an MRAM of the prior art.
Figure 2:
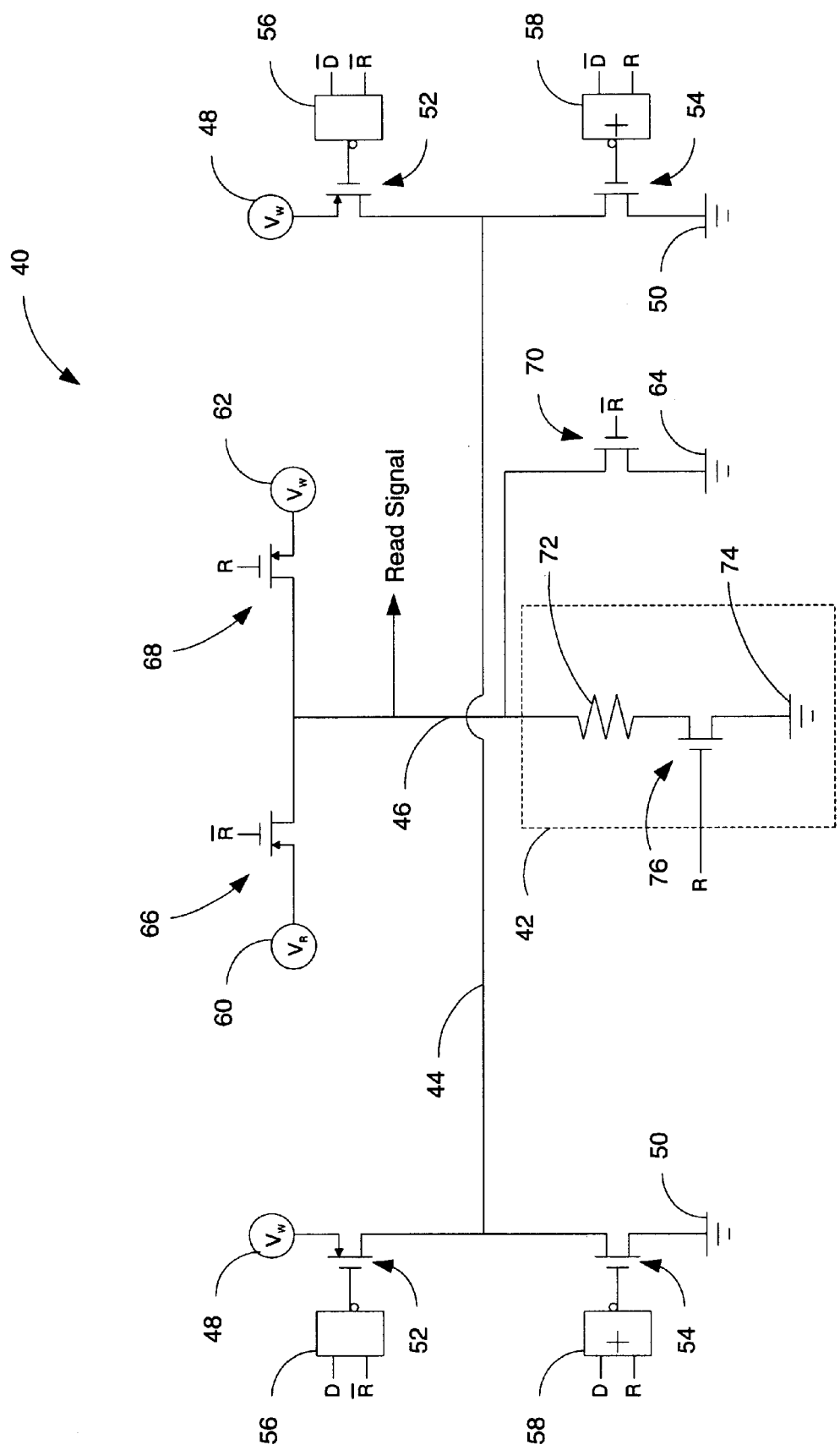
FIG. 2 is a read/write control circuit for a single MRAM unit according to an embodiment of the present invention.

FIG. 2 shows a read/write control circuit 40 for a single magnetic random access memory (MRAM) cell 42 according to an embodiment of the present invention. The read/write control circuit 40 includes a digit line 44 and bit line 46 that both include segments disposed proximate to the MRAM cell 42, which represents schematically the structure shown in FIG. 1. The segment of the digit line 44 is preferably straight and its long axis will thus define a direction. The segment of the bit line 46 is also preferably straight and therefore its long axis defines a second direction. The positions of the digit and bit lines 44, 46 and the directions and the magnitudes of the write currents therein determine the strength and orientation of the combined magnetic field at the free layer 16. Accordingly, it is preferable to arrange the digit and bit lines 44, 46 such that when both are activated the combined magnetic field at the free layer 16 will be oriented either parallel or antiparallel to the fixed magnetic moment orientation 20 of the pinned layer 14.

In an implementation of an array of MTJ cells 42, it is preferable to arrange the digit and bit lines 44, 46 such that the magnetic field generated by either one alone is insufficient to reverse the magnetic moment orientation 22 of the free layer 16, while the combined field produced by both lines exceeds the threshold necessary to reverse the magnetic moment orientation 22 of the free layer 16. In this way a single MRAM cell 42 at the intersection of a digit line 44 and a bit line 46 can be written without affecting the magnetic moment orientations 22 of free layers 16 of other MTJ cells 42 on the same digit line 44 or bit line 46. In preferred embodiments of the present invention the directions of the segments of the digit and bit lines 44, 46 are oriented at approximately 90° to each other, though other angles will also work.

Attached to either end of the digit line 44 is a write current source 48 and a write current sink 50. Each source 48 is connected to its respective end of the digit line 44 by a source transistor 52, and each sink 50 is likewise connected to its respective end of the digit line 44 by a sink transistor 54. As is well known, the flow of electricity from a source to a drain on a transistor can be allowed or stopped by changing a voltage applied to a gate of the transistor. In the present invention transistors can be either n-channel MOS or p-channel MOS, blocking or allowing the flow of electricity when a voltage above a threshold is applied to the gate. The magnitude of the write current $I_w$ is determined by the transistors 52 and 54.

It will be apparent, therefore, that a write current can be made to flow in either direction through digit line 44 by allowing electricity to flow through a source transistor 52 attached to one end of the digit line 44 and through a sink transistor 54 attached to the other end of the digit line 44. Although FIG. 2 shows two write current sources 48 attached to opposite ends of the digit line 44, the invention will also work with a single source 48 attached to both ends of the digit line 44.

A source logic gate 56 is attached to each of the source transistors 52 and a sink logic gate 58 is attached to each of the sink transistors 54. A logic gate can be, for example, a CMOS device capable of performing the logical NAND or NOR function. It will be appreciated, for example, that a logic gate performing the AND function combined with a logic gate performing the NOT function will be equivalent to a logic gate capable of performing the logical function of NAND. Thus, in the present invention a collection of logic gates can be used in place of a single logic gate 56 or 58.

Each logic gate 56, 58 outputs a single logic signal in response to two logic signal inputs. In FIG. 2 the logic signals are shown as R and D and their negatives, $\overline{R}$ and $\overline{D}$, respectively. R is the logic signal for indicating a read or a write operation and in some embodiments the state where R equals 1 and $\overline{R}$ equals 0 indicates a read operation and the state where $\overline{R}$ equals 1 and R equals 0 indicates a write operation. Similarly, D is the logic signal indicating the magnetic moment orientation 22 of the free layer 16 to be set during a write operation. In some embodiments, therefore, the state where D equals 1 and $\overline{D}$ equals 0 indicates that the MRAM cell 42 is to be put into a state where the magnetic moment orientations 20 and 22 are antiparallel. In these embodiments the state where $\overline{D}$ equals 1 and D equals 0 indicates that the MRAM cell 42 is to be put into a state where the magnetic moment orientations 20 and 22 are parallel.

Many combinations can be devised by using either n-channel or p-channel transistors for source and sink transistors 52, 54, and by matching transistors 52, 54 with various logic gates 56, 58. Each such combination will work with a particular set of logic signals. A preferred combination is shown in FIG. 2 in which the source logic gates 56 are both NAND gates and the sink logic gates 58 are both NOR gates. Further, source transistors 52 are p-channel transistors while sink transistors 54 are n-channel transistors. For this combination of logic gates 56, 58 and transistors 52, 54 the logic signal D will be one of the two logic signal inputs into the logic gates 56, 58 on one end of the digit line 44 and the logic signal $\overline{D}$ will be one of the two logic signal inputs into the logic gates 56, 58 on the other end of the digit line 44. Similarly, for this combination the logic signal R will be one of the two logic signal inputs into the logic gates 58 for the sinks 50 and the logic signal $\overline{R}$ will be one of the two logic signal inputs into the logic gates 56 for the sources 48.

The bit line 46 has a read current source 60 and a third write current source 62 electrically connected to one end, and a third write current sink 64 electrically connected to the other end. A first read transistor 66 is disposed between the end of the bit line 46 and the read current source 60, and likewise a third write transistor 68 is disposed between the end of the bit line 46 and the third write current source 62. Additionally, a write transistor 70 is disposed between the opposite end of the bit line 46 and the write current sink 64. Bit line 46 also includes a segment proximate to the MRAM cell 42. This segment has a direction oriented relative to the direction of the segment of the digit line 44. As described above, these two segments are preferably oriented approximately 90° to one another.

Also as above, just as the two write current sources 48 can be implemented as a single source, the read current source 60 and the third write current source 62 can also be implemented as a single current source with a variable output. The variable output is required for a single current source implemented as both read current source 60 and third write current source 62 because the read current needed to read the state of the magnetic tunnel junction 72 is much lower than the write current required to reverse the magnetic moment orientation 22 of the free layer 16. Additionally, a current as strong as the write current can possibly damage the magnetic tunnel junction 72 if it were allowed to pass through. It will be further appreciated that a single variable current source can therefore be implemented for each of the current sources 48, 60, and 62.

Since R is the logic signal for indicating a read or a write operation, R will be the input into a gate of either transistor 66 or 68, while $\overline{R}$ will be the input into a gate of the other transistor 68 or 66. In this way only one of the read current source 60 and the third write current source 62 will be electrically connected to the end of the bit line at any given time when both transistors 66 and 68 are of the same type, either n-channel or p-channel. If the transistors 66 and 68 are of different types then either R or $\overline{R}$ will be the input into the gates of both transistors 66 and 68. In the embodiment illustrated in FIG. 2 both transistors 66 and 68 are p-channel transistors and the input into the gate of transistor 66 is $\overline{R}$ and the input into the gate of transistor 68 is R.

During a write operation current must flow from the third write current source 62 to the third write current sink 64 and therefore during a write operation transistor 70 needs to be controlled to conduct current. Thus, transistor 70 needs to be controlled similarly to transistor 68. For example, when transistor 68 is a p-type transistor having R as the logic signal input to its gate, transistor 70 can be an n-channel transistor having $\overline{R}$ as the logic signal input to its gate, as shown in FIG. 2.

The read/write control circuit 40 further comprises an MRAM cell 42 electrically connected to the bit line 46. The MRAM cell 42 includes a magnetic tunnel junction 72 including (not shown) a free layer 16, a pinned layer 14, and an insulation layer 18 disposed therebetween. The MRAM cell 42 also includes a read current sink 74 electrically connected by a second read transistor 76 to the magnetic tunnel junction 72. Transistors 66 and 68 are connected to the first end of the bit line 46, transistor 70 is connected to the second end of the bit line 46, and free layer 16 or pinned layer 14 is connected to a point on the bit line 46 between the two ends, while the other of the free layer 16 and the pinned layer 14 is electrically connected by the second read transistor 76 to the read current sink 74.

During a read operation current must flow from the read current source 60 to the read current sink 74 through the magnetic tunnel junction 72 and therefore transistor 76 needs to be controlled during a read operation to pass the current. Thus, transistor 76 needs to be controlled similarly to transistor 66. For example, when transistor 66 is a p-type transistor having $\overline{R}$ as the logic signal input to its gate, transistor 76 can be an n-channel transistor having R as the logic signal input to its gate, as shown in FIG. 2. It will also be understood that during a read operation it is necessary to measure the resistance across the magnetic tunnel junction 72 to determine the state it is in. This is achieved by reading the voltage drop across the MRAM cell 42 which can be measured by monitoring the voltage between the bit line at the end attached to the read current source 60 and ground, as shown in FIG. 2.

Figure 3:
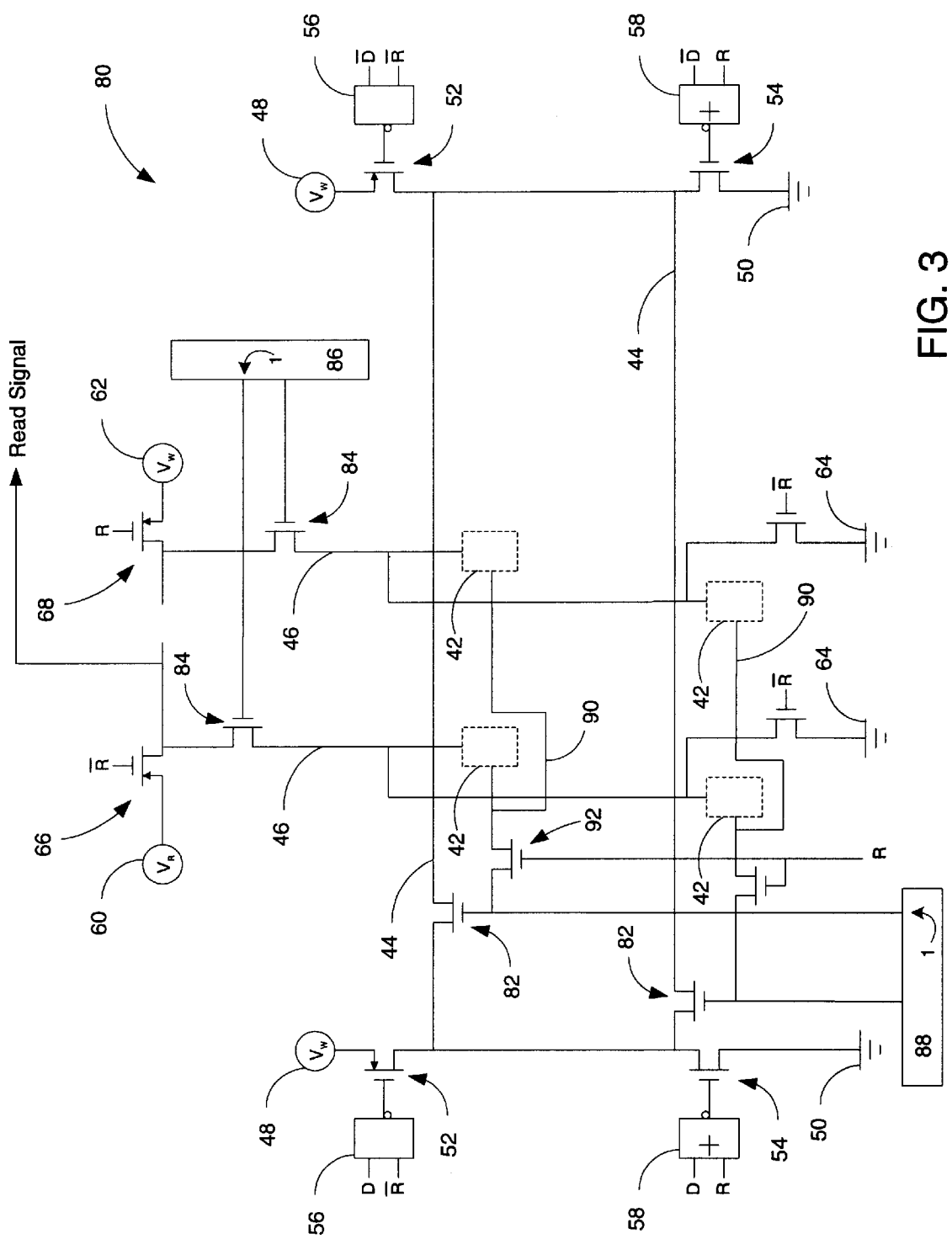
FIG. 3 is a read/write control circuit for an array of MRAM units according to an embodiment of the present invention.

FIG. 3 shows a magnetic tunnel junction MRAM data storage device 80 of the invention. In FIG. 3 there is a node wherever a line representing a conductor terminates at another line representing a conductor, whereas wherever two such lines cross one another there is not a node. Device 80 comprises at least one digit line 44 including a digit line transistor 82, and at least one bit line 46 including a bit line transistor 84. The device 80 further comprises first and second write current sources 48 electrically connected to opposite ends of the at least one digit line 44 and first and second write current sinks 50 electrically connected to opposite ends of the at least one digit line 44. Device 80 also comprises a third write current source 62 (sometimes called a bit line write current source) and a read current source 60 each electrically connected to a first end of the at least one bit line 46, and a third write current sink 64 electrically connected to a second end of the at least one bit line 46. Device 80 additionally comprises at least one MRAM cell 42 disposed proximate to one of the at least one digit line 44 and electrically connected to one of the at least one bit line 46. The at least one MRAM cell 42 includes a magnetic tunnel junction 72 electrically connected to a read current sink 74 by a read transistor 76. Device 80 further includes a column decoder 86 configured to activate one of the at least one bit line 46 by applying a first voltage to a gate of the bit line transistor 84, and a row decoder 88 capable of activating one of the at least one digit line 44 by applying a second voltage to a gate of the digit line transistor 82. Lastly, the device 80 includes a read control line 90 electrically connected at one end to a read control transistor 92 and electrically connected to a gate of the read transistor 76. The read control line transistor 92 is disposed between the output of decoder 88 and the read control line 90 and has a gate controlled by a first logic signal.

As previously described, a voltage in excess of a threshold may switch the state of a transistor when applied to a gate thereof. The logic signals R and D themselves have two states, 0 and 1 which represent voltages above and below the threshold. As noted above, the column decoder 86 activates one of the at least one bit line 46 by applying a first voltage to a gate of the bit line transistor 84, and the row decoder 88 activates one of the at least one digit line 44 by applying a second voltage to a gate of the digit line transistor 82.

In view of the above discussion, it will be appreciated that an MRAM cell 42 is selected by the combined actions of the column decoder 86 and row decoder 88. Provided that the digit line transistor 82 and the bit line transistor 84 are both n-channel transistors as shown in FIG. 3, applying a voltage above the threshold to only one digit line transistor 82 and only one bit line transistor 84 will allow currents to flow through the selected bit line 46 and digit line 44.

In a write operation, where R equals 0, transistor 68 allows current to flow from the third write current source 62 into the selected bit line 46. Similarly, one of the transistors 52 allows current to flow from one of the two write current sources 48 into the selected digit line 44. Further, when R equals 0 the read control line transistor 92 prevents the voltage seen at the gate of the digit line transistor 82 from reaching the gate of the read transistor 76.

In a read operation, where R equals 1, transistor 66 allows current to flow from the read current source 60 into the selected bit line 46. An MRAM cell 42 is selected to be read by applying a high voltage to one of the bit line transistors 84 and one of read control line 90. During a read operation the logic gates 56 prevent either write current source 48 from being connected to the digit line 44 to prevent a write current from flowing in the digit line 44. When R equals 1, however, the read control line transistor 92 completes the circuit between the output of decoder 88 and the gate of the read transistor 76 in the selected MRAM cell 42. Thus, the high voltage generated by the row decoder 88 is applied to the gate of the read transistor 76 so that a circuit is completed from the bit line 46 and through the magnetic tunnel junction 72 to the read current sink 74. Any read transistor 76 connected to the same read control line 90 will also see the voltage generated by the row decoder 88 when R equals 1; however, this has no consequence since only one bit line 46 carries the read current.

In the foregoing specification, the invention is described with reference to specific embodiments thereof, but those skilled in the art will recognize that while the invention is not limited thereto. Various features and aspects of the above-described invention may be used individually or jointly. Further, although the invention has been described in the context of its implementation in a particular environment and for particular applications, its usefulness is not limited thereto and it can be utilized in any number of environments and applications without departing from the broader spirit and scope thereof. The specification and drawings are, accordingly, to be regarded as illustrative rather than restrictive.

What is claimed is:

1. A write control circuit for a magnetic tunnel junction MRAM, comprising:
    a digit line including
        a first end
            electrically connected to a first write current source by a first write transistor having a gate controlled by a first write logic gate, and
            electrically connected to a first write current sink by a first sink transistor having a gate controlled by a first sink logic gate,
        a second end
            electrically connected to a second write current source by a second write transistor having a gate controlled by a second write logic gate, and
            electrically connected to a second write current sink by a second sink transistor having a gate controlled by a second sink logic gate, and
        a segment disposed in a first direction proximate to the magnetic tunnel junction MRAM; and
    a bit line including
        a third write current source electrically connected to a first end,
        a third write current sink electrically connected to a second end, and
        a segment, disposed in a second direction oriented approximately 90° to the first direction, proximate to the magnetic tunnel junction MRAM.

2. The write control circuit of claim 1 wherein the first and second write transistors are p-channel MOS transistors.

3. The write control circuit of claim 2 wherein the first and second write logic gates are NAND gates.

4. The write control circuit of claim 3 wherein the first write logic gate is configured to accept first and second logic signals and the second write logic gate is configured to accept the first logic signal and an inverse of the second logic signal.

5. The write control circuit of claim 1 wherein the first and second sink transistors are n-channel MOS transistors.

6. The write control circuit of claim 5 wherein the first and second sink logic gates are NOR gates.

7. The write control circuit of claim 6 wherein the first sink logic gate is configured to accept first and second logic signals and the second sink logic gate is configured to accept the first logic signal and the inverse of the second logic signal.

8. The write control circuit of claim 6 wherein the first and second write transistors are p-channel MOS transistors and the first and second write logic gates are NAND gates.

9. The write control circuit of claim 8 wherein
    the first write logic gate is configured to accept first and second logic signals,
    the second write logic gate is configured to accept the first logic signal and the inverse of the second logic signal,
    the first sink logic gate is configured to accept the second logic signal and an inverse of the first logic signal, and
    the second sink logic gate is configured to accept the inverse of the second logic signal and the inverse of the first logic signal.

10. A read/write control circuit for a magnetic tunnel junction MRAM, comprising:
    a digit line including
        a first end
            electrically connected to a first write current source by a first write transistor having a gate controlled by a first write logic gate, and
            electrically connected to a first write current sink by a first sink transistor having a gate controlled by a first sink logic gate,
        a second end
            electrically connected to a second write current source by a second write transistor having a gate controlled by a second write logic gate, and
            electrically connected to a second write current sink by a second sink transistor having a gate controlled by a second sink logic gate, and
        a segment disposed in a first direction proximate to a magnetic tunnel junction; and
    a bit line including
        a third write current source electrically connected to a first end by a third write transistor,
        a third write current sink electrically connected to a second end by a third sink transistor,
        a segment electrically connected to a first surface of the magnetic tunnel junction and having a second direction oriented approximately 90° to the first direction;
        a read current source electrically connected to the first end by a first read transistor, and
        a read current sink electrically connected to a second surface of the magnetic tunnel junction by a second read transistor.

11. The write control circuit of claim 10 wherein the first and second write transistors are p-channel MOS transistors.

12. The write control circuit of claim 11 wherein the first and second write logic gates are NAND gates.

13. The write control circuit of claim 12 wherein the first write logic gate is configured to accept first and second logic signals and the second write logic gate is configured to accept the first logic signal and an inverse of the second logic signal.

14. The write control circuit of claim 10 wherein the first and second sink transistors are n-channel MOS transistors.

15. The write control circuit of claim 10 wherein the first and second sink logic gates are NOR gates.

16. The write control circuit of claim 15 wherein the first sink logic gate is configured to accept first and second logic signals and the second sink logic gate is configured to accept the first logic signal and an inverse of the second logic signal.

17. The write control circuit of claim 15 wherein the first and second write transistors are p-channel MOS transistors and the first and second write logic gates are NAND gates.

18. The write control circuit of claim 17 wherein
    the first write logic gate is configured to accept first and second logic signals,
    the second write logic gate is configured to accept the first logic signal and a inverse of the second logic signal,
    the first sink logic gate is configured to accept the second logic signal and a inverse of the first logic signal, and
    the second sink logic gate is configured to accept the inverse of the second logic signal and the inverse of the first logic signal.

19. The write control circuit of claim 10 wherein the third write transistor is controlled by a first logic signal and the first read transistor is controlled by an inverse of the first logic signal.

20. The write control circuit of claim 10 wherein the third write transistor and the first read transistor are p-channel MOS transistors.

21. The write control circuit of claim 10 wherein the third sink transistor is controlled by a first logic signal and the second read transistor is controlled by an inverse of the first logic signal.

22. The write control circuit of claim 21 wherein the third write transistor is controlled by the first logic signal and the first read transistor is controlled by the inverse of the first logic signal.

23. The write control circuit of claim 10 wherein the third sink transistor and the second read transistor are n-channel MOS transistors.

24. A magnetic data storage unit comprising:
   a magnetic tunnel junction;
   a digit line including
      a first end
         electrically connected to a first write current source by a first write transistor having a gate controlled by a first write logic gate, and
         electrically connected to a first write current sink by a first sink transistor having a gate controlled by a first sink logic gate,
      a second end
         electrically connected to a second write current source by a second write transistor having a gate controlled by a second write logic gate, and
         electrically connected to a second write current sink by a second sink transistor having a gate controlled by a second sink logic gate, and
      a segment, disposed in a first direction, proximate to the magnetic tunnel junction; and
   a bit line including
      a third write current source electrically connected to a first end by a third write transistor,
      a third write current sink electrically connected to a second end by a third sink transistor,
      a segment, disposed in a second direction oriented approximately 90° to the first direction, electrically connected to a first surface of the magnetic tunnel junction,
      a read current source electrically connected to the first end by a first read transistor, and
      a read current sink electrically connected to a second surface of the magnetic tunnel junction by a second read transistor.

25. The magnetic data storage unit of claim 24 wherein the magnetic tunnel junction includes:
   a pinned layer electrically connected to the read current sink and set proximate to the digit line,
   a free layer electrically connected to the bit line, and
   a spacer layer disposed between the pinned and free layers.

26. The magnetic data storage unit of claim 24 wherein the magnetic tunnel junction includes:
   a free layer electrically connected to the read current sink and set proximate to the digit line,
   a pinned layer electrically connected to the bit line, and
   a spacer layer disposed between the pinned and free layers.

27. The write control circuit of claim 24 wherein the first and second write transistors are p-channel MOS transistors.

28. The write control circuit of claim 27 wherein the first and second write logic gates are NAND gates.

29. The write control circuit of claim 28 wherein the first write logic gate is configured to accept first and second logic signals and the second write logic gate is configured to accept the first logic signal and an inverse of the second logic signal.

30. The write control circuit of claim 24 wherein the first and second sink transistors are n-channel MOS transistors.

31. The write control circuit of claim 24 wherein the first and second sink logic gates are NOR gates.

32. The write control circuit of claim 31 wherein the first sink logic gate is configured to accept first and second logic signals and the second sink logic gate is configured to accept the first logic signal and the inverse of the second logic signal.

33. The write control circuit of claim 31 wherein the first and second write transistors are p-channel MOS transistors and the first and second write logic gates are NAND gates.

34. The write control circuit of claim 33 wherein
   the first write logic gate is configured to accept first and second logic signals,
   the second write logic gate is configured to accept the first logic signal and a inverse of the second logic signal,
   the first sink logic gate is configured to accept the second logic signal and a inverse of the first logic signal, and
   the second sink logic gate is configured to accept the inverse of the second logic signal and the inverse of the first logic signal.

35. The write control circuit of claim 24 wherein the third write transistor is controlled by a first logic signal and the first read transistor is controlled by an inverse of the first logic signal.

36. The write control circuit of claim 24 wherein the third write transistor and the first read transistor are p-channel MOS transistors.

37. The write control circuit of claim 24 wherein the third sink transistor is controlled by a first logic signal and the second read transistor is controlled by an inverse of the first logic signal.

38. The write control circuit of claim 37 wherein the third write transistor is controlled by the first logic signal and the first read transistor is controlled by the inverse of the first logic signal.

39. The write control circuit of claim 24 wherein the third sink transistor and the second read transistor are n-channel MOS transistors.

40. A magnetic tunnel junction MRAM data storage device comprising:
   at least one digit line including a digit line transistor;
   first and second write current sources electrically connected to opposite ends of the at least one digit line;
   first and second write current sinks electrically connected to opposite ends of the at least one digit line;
   at least one bit line including a bit line transistor;
   a third write current source and a read current source each electrically connected to a first end of the at least one bit line;
   a third write current sink electrically connected to a second end of the at least one bit line;

a column decoder configured to activate one of the at least one bit line by applying a first voltage to a gate of the bit line transistor;

at least one MTJ cell disposed proximate to one of the at least one digit line and electrically connected to one of the at least one bit line and including a read current sink electrically connected to a magnetic tunnel junction by a read transistor;

at least one read control line having a first end connected to a gate of the digit line transistor and a second end connected to a gate of the read transistor of the at least one MTJ cell and including a read control line transistor disposed between the two ends having a gate controlled by a first logic signal; and a row decoder capable of activating one of the at least one digit line by applying a second voltage to the gate of the digit line transistor.

41. The write control circuit of claim 40 wherein the first and second write transistors are p-channel MOS transistors.

42. The write control circuit of claim 41 wherein the first and second write logic gates are NAND gates.

43. The write control circuit of claim 42 wherein the first write logic gate is configured to accept first and second logic signals and the second write logic gate is configured to accept the first logic signal and an inverse of the second logic signal.

44. The write control circuit of claim 40 wherein the first and second sink transistors are n-channel MOS transistors.

45. The write control circuit of claim 40 wherein the first and second sink logic gates are NOR gates.

46. The write control circuit of claim 45 wherein the first sink logic gate is configured to accept first and second logic signals and the second sink logic gate is configured to accept the first logic signal and an inverse of the second logic signal.

47. The write control circuit of claim 45 wherein the first and second write transistors are p-channel MOS transistors and the first and second write logic gates are NAND gates.

48. The write control circuit of claim 47 wherein the first write logic gate is configured to accept first and second logic signals, the second write logic gate is configured to accept the first logic signal and a inverse of the second logic signal, the first sink logic gate is configured to accept the second logic signal and a inverse of the first logic signal, and the second sink logic gate is configured to accept the inverse of the second logic signal and the inverse of the first logic signal.

49. The write control circuit of claim 40 wherein the third write transistor is controlled by a first logic signal and the first read transistor is controlled by an inverse of the first logic signal.

50. The write control circuit of claim 40 wherein the third write transistor and the first read transistor are p-channel MOS transistors.

51. The write control circuit of claim 40 wherein the third sink transistor is controlled by a first logic signal and the second read transistor is controlled by an inverse of the first logic signal.

52. The write control circuit of claim 51 wherein the third write transistor is controlled by the first logic signal and the first read transistor is controlled by the inverse of the first logic signal.

53. The write control circuit of claim 40 wherein the third sink transistor and the second read transistor are n-channel MOS transistors.

* * * * *